United States Patent
Rai et al.

(10) Patent No.: US 9,916,403 B1
(45) Date of Patent: Mar. 13, 2018

(54) METHOD AND SYSTEM FOR EFFICIENTLY DETERMINING DIFFERENTIAL VOLTAGES FOR ELECTROSTATIC DISCHARGE SIMULATIONS

(71) Applicant: Cadence Design Systems, Inc., San Jose, CA (US)

(72) Inventors: Nityanand Rai, Noida (IN); Hui Zheng, Round Rock, TX (US); Xin Gu, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/199,939

(22) Filed: Jun. 30, 2016

(51) Int. Cl.
*G06F 17/50* (2006.01)

(52) U.S. Cl.
CPC ................ *G06F 17/5009* (2013.01)

(58) Field of Classification Search
CPC .................................................. G06F 17/5009
USPC ......................................................... 716/106
See application file for complete search history.

(56) References Cited

U.S. PATENT DOCUMENTS

| | | | | |
|---|---|---|---|---|
| 8,116,048 B1* | 2/2012 | Gallerano | ................ | H02H 3/22 361/111 |
| 8,560,294 B1* | 10/2013 | Ren | ...................... | G06F 17/5036 703/14 |
| 2004/0155675 A1* | 8/2004 | Zerbe | .................. | H01L 27/0251 326/30 |
| 2013/0257453 A1* | 10/2013 | Hernandez | ........... | G01R 31/002 324/612 |

\* cited by examiner

*Primary Examiner* — Suchin Parihar
(74) *Attorney, Agent, or Firm* — Vista IP Law Group, LLP (57) ABSTRACT

An improved approach is provided for determining differential voltages for driver and receiver pairs as a result of electrostatic discharge (ESD) events including identifying circuits of interest, re-characterizing the circuits of interest into a system for evaluating differential voltages, determining the differential voltages for ESD pin locations, and outputting results after iterating through all the ESD pin locations. In some embodiments, re-characterizing may include performing a resistance only extraction of a net, attaching a resistance to any node in the circuit and to ground, formulating a conductance matrix and distributing the total current I as source points. In some embodiments, determining differential voltages for ESD pin locations may include, stamping a first ESD pin location with a total current, solving for the system using previously computed values, mapping the driver and receiver pairs to the nodes in the system, computing the differential voltage, and recording the lowest differential voltage.

21 Claims, 9 Drawing Sheets

METHOD AND SYSTEM FOR EFFICIENTLY DETERMINING DIFFERENTIAL VOLTAGES FOR ELECTROSTATIC DISCHARGE SIMULATIONS

FIELD

The present disclosure relates to electronic design automation (EDA), and more specifically, to a method for analyzing a model of an electrical circuit.

BACKGROUND

EDA software tools may be used in the design and analysis of numerous electronic systems such as printed circuit boards (PCBs) and integrated circuits (ICs). To design a circuit, such as an integrated circuit (IC), a designer first creates high level behavior descriptions of the IC device using a high-level hardware design language (HDL). Common examples of HDLs include Verilog and VHDL. An EDA system typically receives the high level behavioral descriptions of the IC device and translates this high-level design language into netlists of various levels of abstraction. Essentially, the process to implement an electronic device begins with functional design and verification (e.g., using RTL), and then proceeds to physical design of a layout and verification.

Circuit designers and verification engineers use different methods to verify circuit designs. One common method of verification is the use of simulation. Simulation dynamically verifies a design by monitoring behaviors of the design with respect to test stimuli. For many types of designs, simulation can and should be performed during the design process to ensure that the ultimate goals are achievable and will be realized by the finished product.

For example, SPICE and FASTSPICE are common types of simulators that perform simulation to verify the operation of an electronic design. With these types of tools, the electronic design is converted into a system of equation(s), which is then solved for a given set of inputs to check the state of specific portions of the circuit at given points in time.

Some EDA tools are configured to handle the issue of electro static discharge ("ESD"). ESD generally relates to the transfer of charge between bodies at different electrical potentials. However, electrostatic discharge may alter the electrical characteristics of a semiconductor device, which may degrade or destroy the device. Since ESD is a high surge current relative to those for otherwise normal operation of the device, EDS events can cause major reliability problems in integrated circuits and for the semiconductor industry. Furthermore, ESD may also be a cause of oxide damage in integrated circuits.

In order to protect the functional modules in integrated circuits from ESD events, protection cells are often utilized between the functional modules and the input/output ("I/O") terminals (e.g., bumps, pins, pads, etc.) of the integrated circuit. For example, for ESD protection it is often required that for each bump in the electrical circuit there exists an ESD cell through which its static charge can be discharged without damaging the device. To ensure that static charge on a bump is discharged only through the bump of the device, it is necessary to ensure that the effective electrical resistance of the bump is below an identified threshold so that the static charge does not go through any other device. In order to ensure this, a large number of effective electrical resistances need to be calculated from multiple sources to multiple destinations.

Furthermore, it has been seen that the current caused by ESD events can be so large that the current gets uniformly distributed on a net before it gets drained out. Meanwhile, even when the bumps of the devices behave as expected, there could be large voltage drops across driver and receiver pairs due to a large current flowing and a high resistance between the driver and receiver pairs, which could be the new cause of oxide damage. Therefore, what is needed is an efficient way to simulate the multiple drainage/sink nodes and identify all driver-receiver pairs with differential voltages above a given threshold. Finally, this need is aggravated by the sheer size of the circuits that need simulating.

SUMMARY

Embodiments of the invention provide an improved method, apparatus, and computer program product for efficiently determining differential voltages for electrostatic discharge simulations.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

In order that the present invention is better understood, some embodiments of the invention will now be described, by way of example only, with reference to the accompanying drawings.

DETAILED DESCRIPTION

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Embodiments of the invention provide an improved method, system, and computer program product for efficiently determining differential voltages for electrostatic discharge (ESD) simulations. By providing a process which includes receiving design data, identifying circuits of interest, re-characterizing the circuits of interest into a system for evaluating differential voltages, determining the differential voltages for ESD pin locations and outputting results. Where the process improves on the traditional solutions by decreasing complexity and by providing a process that that has an increased ability to leverage parallelization.

In some embodiments, the process may include a computer-implemented method for determining differential voltages for driver and receiver pairs as a result of ESD events. The method may include receiving design data, identifying circuits of interest, re-characterizing the circuits of interest into a system for evaluating differential voltages, determining the differential voltages for ESD pin locations and outputting results.

In some embodiments, identification of circuits of interest may include identifying design inputs and ESD event pin locations, and may also include identifying all the driver and receiver pairs.

In some embodiments, re-characterizing the circuits of interest may include performing a resistance only extraction of a net to be simulated, attaching an additional resistance to any node in the circuit and to ground, formulating a conductance matrix and distributing the total current I as source points.

In some embodiments, determining the differential voltages for ESD pin locations may include stamping a first ESD pin location with a total current of −I, solving GV=I using a previously computed G and I, mapping the driver and receiver instances to the nodes in G, computing the differential voltage $V_{dr}=V_r-V_d$, and recording the new differential voltage when the old differential voltage is less than the computed differential voltage. Finally, the process may be iterated when there are remaining ESD pin locations for evaluation.

In some embodiments, determining differential voltages may be executed in parallel using multiple processors or processing cores, and may be further sped up using an incremental forward solve method.

The traditional solution has a complexity of K*factorization+2*K*half_solve and limited parallelization. As is known, the traditional solution includes uniformly distributing a given current I on a given layer where each node is assigned a current source of I/N where N is equal to the number of nodes, grounding one ESD sink point at a time, factorizing and solving the associated matrix, computing the differential voltages across all driver and receiver pairs, associated each driver and receiver pair with the worst ESD event point, and then repeated the process from the grounding step for the next ESD sink point to be simulated until no simulation points are remaining.

In contrast the present approach has a complexity of 1*factorization+2*K*half_solve and is massively parallelizable because the present approach does not require re-factorization for each driver and receiver pair.

Furthermore, by storing the result of a partial forward solve the complexity can further be decreased to 1*factorization+~K*half_solve.

Figure 1:
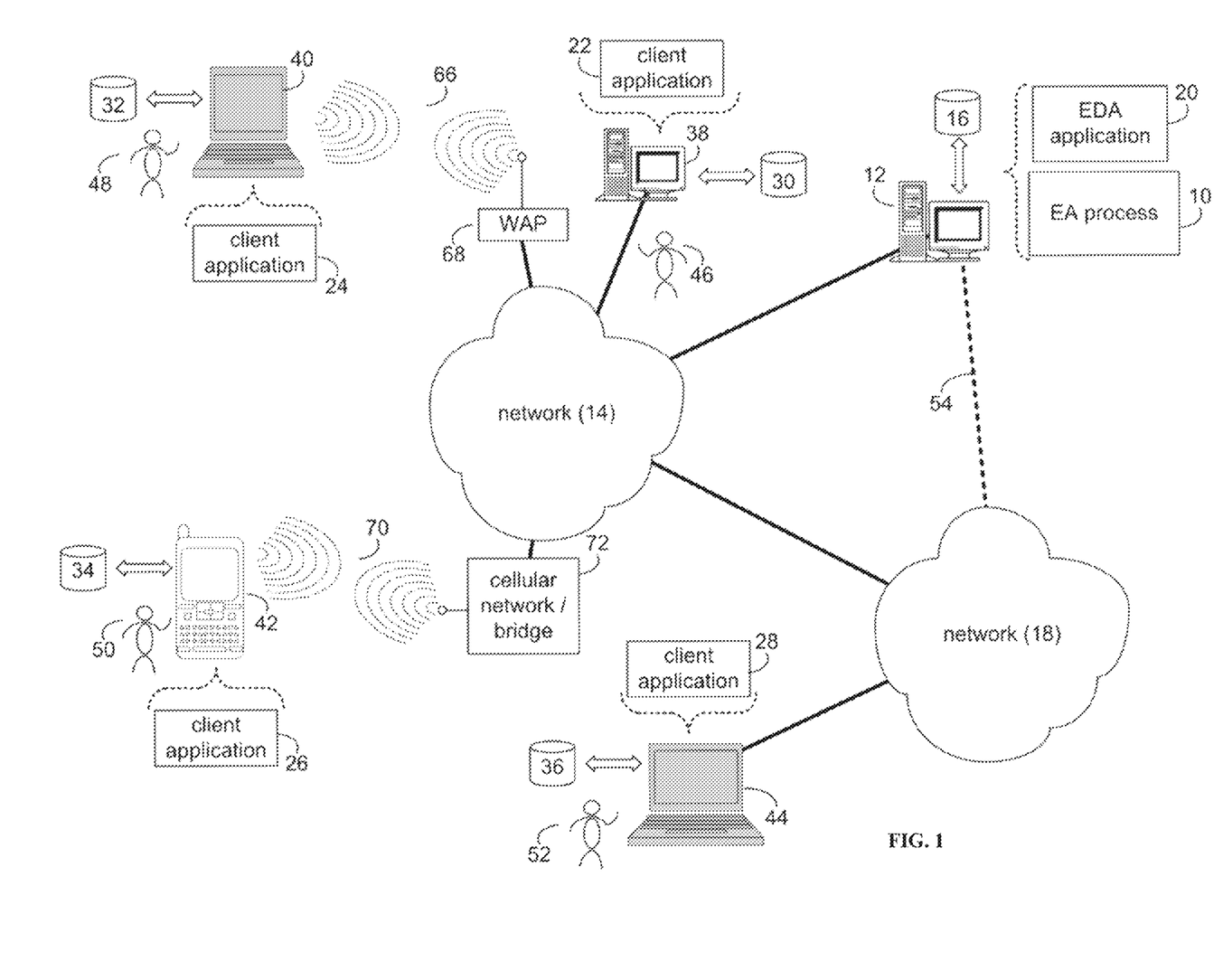
FIG. 1 illustrates an example environment which may be employed in some embodiments of the invention to implement the techniques disclosed herein.

FIG. 1 illustrates an example environment which may be employed in some embodiments of the invention to implement the techniques disclosed herein. The environment is intended to be illustrate of different aspects of an example environment that may be used to implement the techniques disclosed herein. However, alternative environments may utilize a single device or some combination of the elements disclosed herein, or others as may be appropriate.

Electrical analysis process 10 may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the electrical analysis process may reside on and be executed, in whole or in part, by a client electronic device, such as a personal computer, notebook computer, personal digital assistant, or the like.

The instruction sets and subroutines of electrical analysis process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Web server, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Electrical analysis process 10 may be a stand-alone application, or may be an applet/application/script that may interact with and/or be executed within EDA application 20. In addition or as an alternative to being a server-side process, the electrical analysis process may be a client-side process (not shown) that may reside on a client electronic device (described below) and may interact with an EDA client application (e.g., one or more of EDA client applications 22, 24, 26, 28). Further, the electrical analysis process may be a hybrid server-side/client-side process that may interact with EDA application 20 and an EDA client application (e.g., one or more of client applications 22, 24, 26, 28). As such, the electrical analysis process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize electrical analysis process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.)

Figure 2:
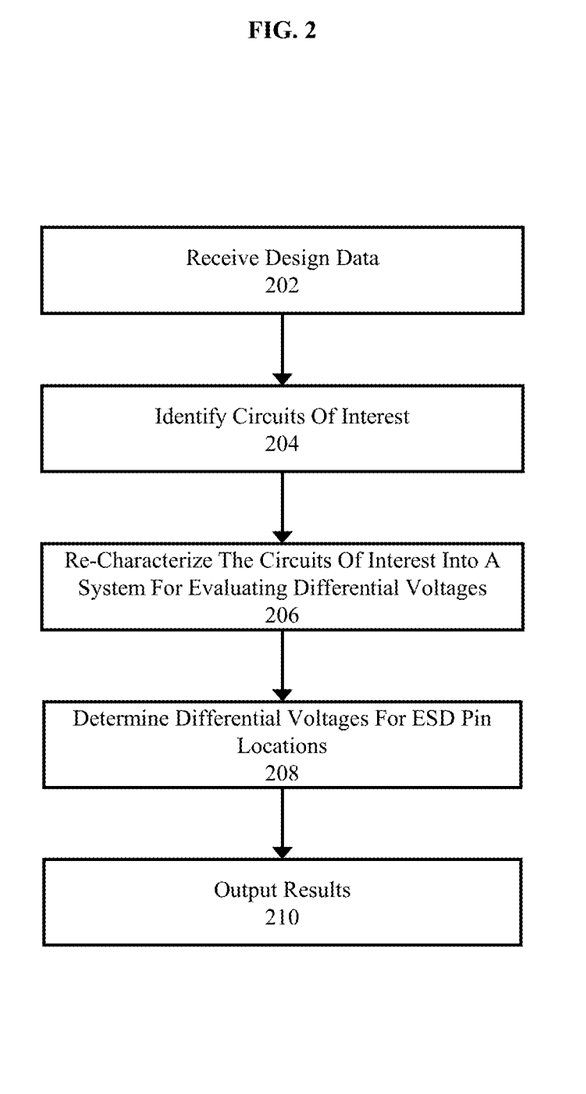
FIG. 2 shows a flowchart of an approach to determine differential voltages for electrostatic discharge (ESD) simulations according to some embodiments of the invention.

FIG. 2 shows a flowchart of an approach to determine differential voltages for electrostatic discharge (ESD) simulations according to some embodiments of the invention. Generally, the approach includes identifying circuits to be evaluated, converting them into a solvable system for evaluation and then evaluating those circuits.

Receiving design data at 202 could be performed by loading the design data directly from a file, accessing it over a network, accessing it within a program such as the EDA design program, or any combination thereof.

Identifying circuits of interest at 204 could be performed using an automated or manual process. For instance, the user could tag specific nets they are interested in simulating, the user could specify rules for selecting what nets to simulate, or the EDA application could apply default rules or preconfigured rules to select the nets for simulation. For instance, the EDA tools might select all nets that are connected to an external source. Furthermore, any default or preconfigured rules could be modified by the user.

The identified circuits of interest may be re-characterized into a system for evaluation differential voltages at 206. As will be discussed in more detail in regard to FIGS. 4 and 5A-C, the circuits will be re-characterized in a manner to enable the circuits to be evaluated in a less computationally intensive manner.

After the circuits have be re-characterized, those re-characterized circuits can be evaluated at 208 by determining differential voltages for ESD Pin locations at 208. As will be discussed in more detail in regard to FIGS. 6-7, the circuits can be evaluated in a serial manner or a parallel manner by determining the lowest differential voltage for a driver and receiver pair.

Finally, at 210 the results may be output. Such an output could be in many different forms. For instance, the output could be stored within a data file associated with other simulation results, it could be stored separately in a separate data file, or it could be stored as a subset of other data. The stored output may further be accessible for review, such as through the EDA tools, and/or the output could be electronically analyzed according to a set of one or more rules to determine when the circuit meets design targets or other benchmarks.

Figure 3:
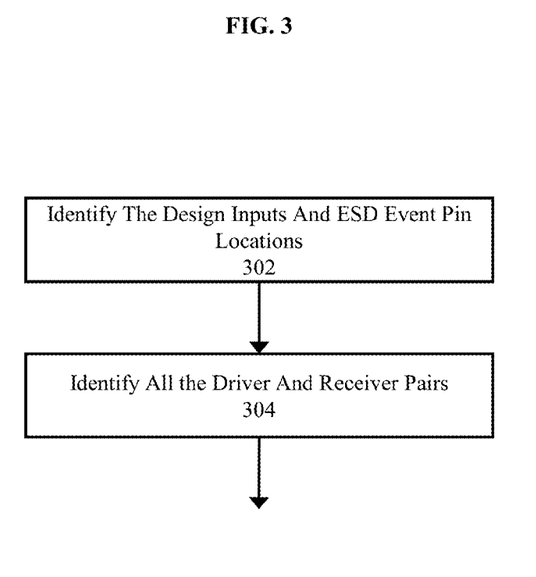
FIG. 3 shows a more detailed view of one approach to identifying circuits of interest in FIG. 2 according to some embodiments of the invention.

FIG. 3 shows a more detailed view of one approach to identifying circuits of interest in FIG. 2 according to some embodiments of the invention. Specifically, FIG. 3 provides one implementation to identify circuits of interest, though other methods could be used to perform the same function.

The process includes, identifying the design inputs and ESD event pin locations at 302. The ESD event pin locations could be manually identified or automatically identified at 302 as discussed above in regard to FIG. 2.

Furthermore, the process could identify all the driver and receiver pairs at 304, by analyzing a subset of data associated with the ESD event pin locations.

Figure 4:
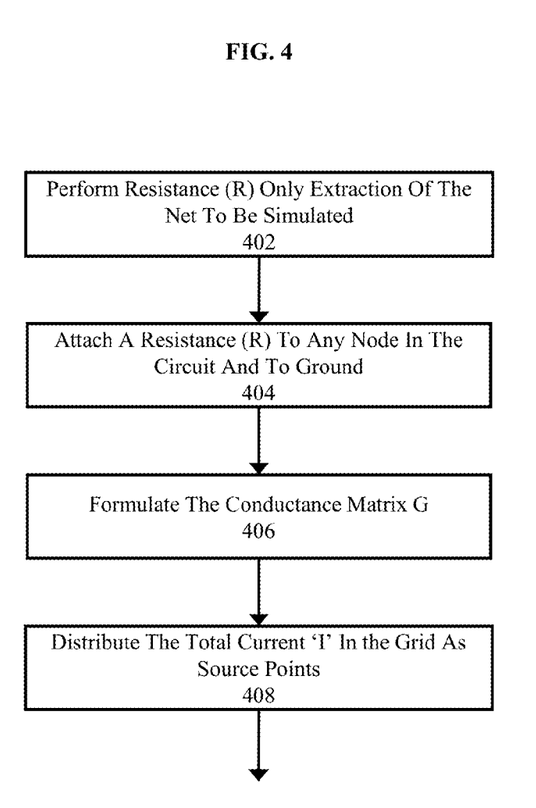
FIG. 4 shows a more detailed view of one approach re-characterizing circuits of interest into a system for evaluating differential voltages in FIG. 2 according to some embodiments of the invention.

FIG. 4 shows a more detailed view of one approach re-characterizing circuits of interest into a system for evaluating differential voltages in FIG. 2 according to some embodiments of the invention. The approach includes, performing a resistance (R) only extraction of the net to be simulated at 402, attaching a resistance (R) to any node in the circuit and to ground at 404, formulating the conductance matrix G at 406, and distributing the total current I in the grid as source points at 408.

The resistance (R) only extraction can be performed at 402. This can be accomplished by any known method and therefore will not be explained further here. After the resistance only extraction is completed, a resistance (R) is connected to is attached to any node in the circuit at 404 to correct for the fact that the recited process results in a singular matrix. This will be further discussed in regard to FIGS. 5A-C below.

A conductance matrix G is then formulated at 406. This can be accomplished by any known method and therefore will not be explained further here. The total current I is distributed in the grid as source points. This can also be accomplished by any known method and therefore will not be explained further here.

Figure 5A:
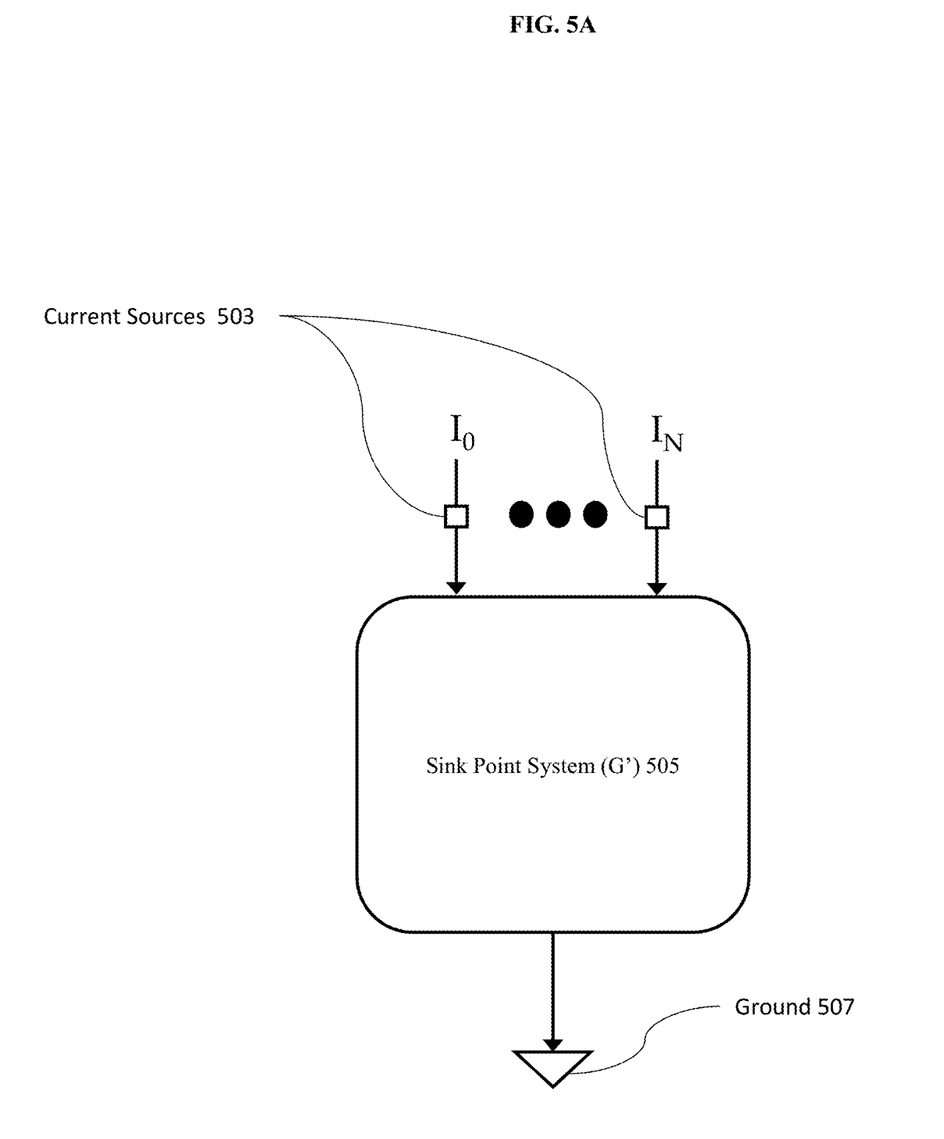
FIGS. 5A-C shows an illustrative view of the process described in FIG. 4 according to some embodiments of the invention.
Figure 5B:
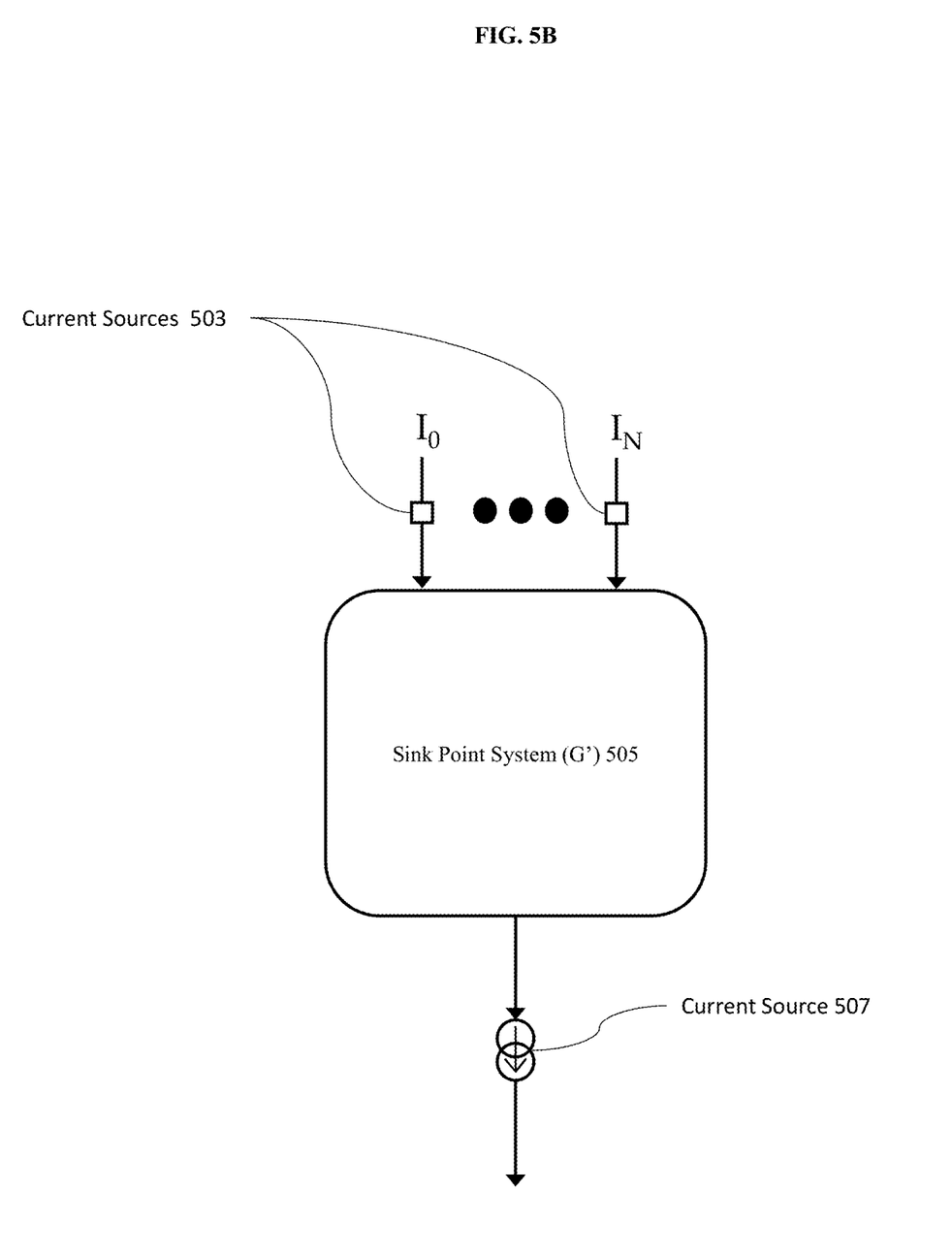
Figure 5C:
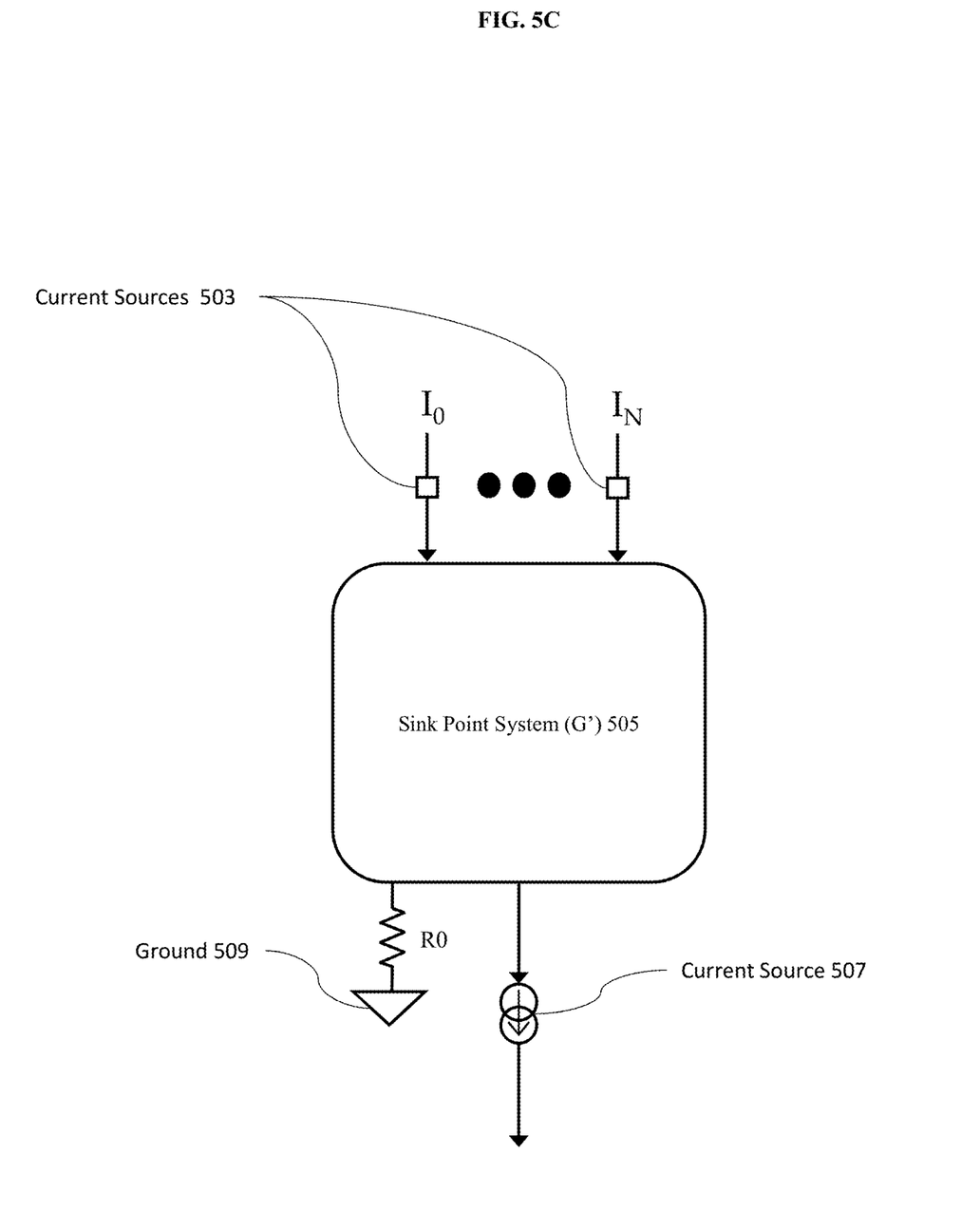

FIGS. 5A-C shows an illustrative view of the process described in FIG. 4 according to some embodiments of the invention. Specifically, these figures illustrate the re-characterization of the system.

FIG. 5A illustrates an initial representation of the sink point system before re-characterization. FIG. 5A includes 'N' current sources $I_i$ which provides a total current I (($\Sigma I_i = I$)) 503 to the sink point system (G') 505 which is connected to ground at 507.

In this way the initial representation of the sink point system (G') is provided which represents the system to be simulated in response to an ESD event that causes a current I.

Here the illustration of FIG. 5A can be represented as:

$$\begin{bmatrix} G' & B \\ B_t & 0 \end{bmatrix} * \begin{bmatrix} V' \\ I_{gnd} \end{bmatrix} = \begin{bmatrix} I' \\ 0 \end{bmatrix} \quad \text{Eq. 1}$$

FIG. 5B illustrates the same sink point systems (G') 505 of FIGS. 5A-B, but now with the addition of the current source 507 connected to the sink point (G') 505.

From the mathematical stand point, this is the source of the singularity discussed above, where a current source −I is attached to a sink point during the process of determining differential voltages for ESD pin locations.

Mathematically, the representation of the illustration of FIG. 5A implies that $G'V'+BI_{gnd}=I'$ where I' is an external current sources and B is a unit vector. This can be multiplied by the identity vector $U=[1\ 1\ 1\ \ldots\ 1_N]$ on both sides to get $UG'V'+UBI_{gnd}=UI'$. Now, applying Kirchhoff's Current Law (KCL) to the equation results in $UG'V'=0$, and $UI'=\Sigma I_{ext}$, and therefore $I_{gnd}=\Sigma I_{ext}$.

FIG. 5C Illustrates the same sink point system (G') 505 with the addition of a resistance RO connected to a node of the sink point system (G') and to ground 509. This modification of FIG. 5B corresponds to the connection of a resistance (R) being connected to any node in the circuit at 404.

The connection of the resistance RO serves to correct for the singularity described above. This can be mathematically represented by equation 2 below, where $G_R$ is for R, $V_R$ represents the voltage across R and $I_R$ is the current through R.

$$\begin{bmatrix} G' & B \\ B_t & G_R \end{bmatrix} * \begin{bmatrix} V' \\ V_R \end{bmatrix} = \begin{bmatrix} I' \\ I_R \end{bmatrix} \quad \text{Eq. 2}$$

Which can be rewritten as:

$$\begin{bmatrix} G' & B \\ B_t & G_R \end{bmatrix} * \left( \begin{bmatrix} V' - V_R \\ 0 \end{bmatrix} + V_R \begin{bmatrix} 1 \\ 1 \end{bmatrix} \right) = \begin{bmatrix} I' \\ I_R \end{bmatrix} \quad \text{Eq. 3}$$

and since $$\begin{bmatrix} G' & B \end{bmatrix} * \begin{bmatrix} 1 \\ 1 \end{bmatrix} = \begin{bmatrix} 0 \\ 0 \end{bmatrix} \quad \text{Eq. 4}$$

implies that $$\begin{bmatrix} G' & B \\ B_t & G_R \end{bmatrix} * \begin{bmatrix} V' - V_R \\ 0 \end{bmatrix} = \begin{bmatrix} I' \\ I_R - \dfrac{V_R}{R} \end{bmatrix} \quad \text{Eq. 5}$$

and implies that $$[G'] * [V' - V_R] = [I'] \quad \text{Eq. 6}$$

Then, all nodes voltages are shifted by $V_R$ and the difference between any two node voltages remains constant in the presences of the grounded resistor. Therefore, the present solution can be used to determine differential voltages for driver and receiver pairs.

Figure 6A:
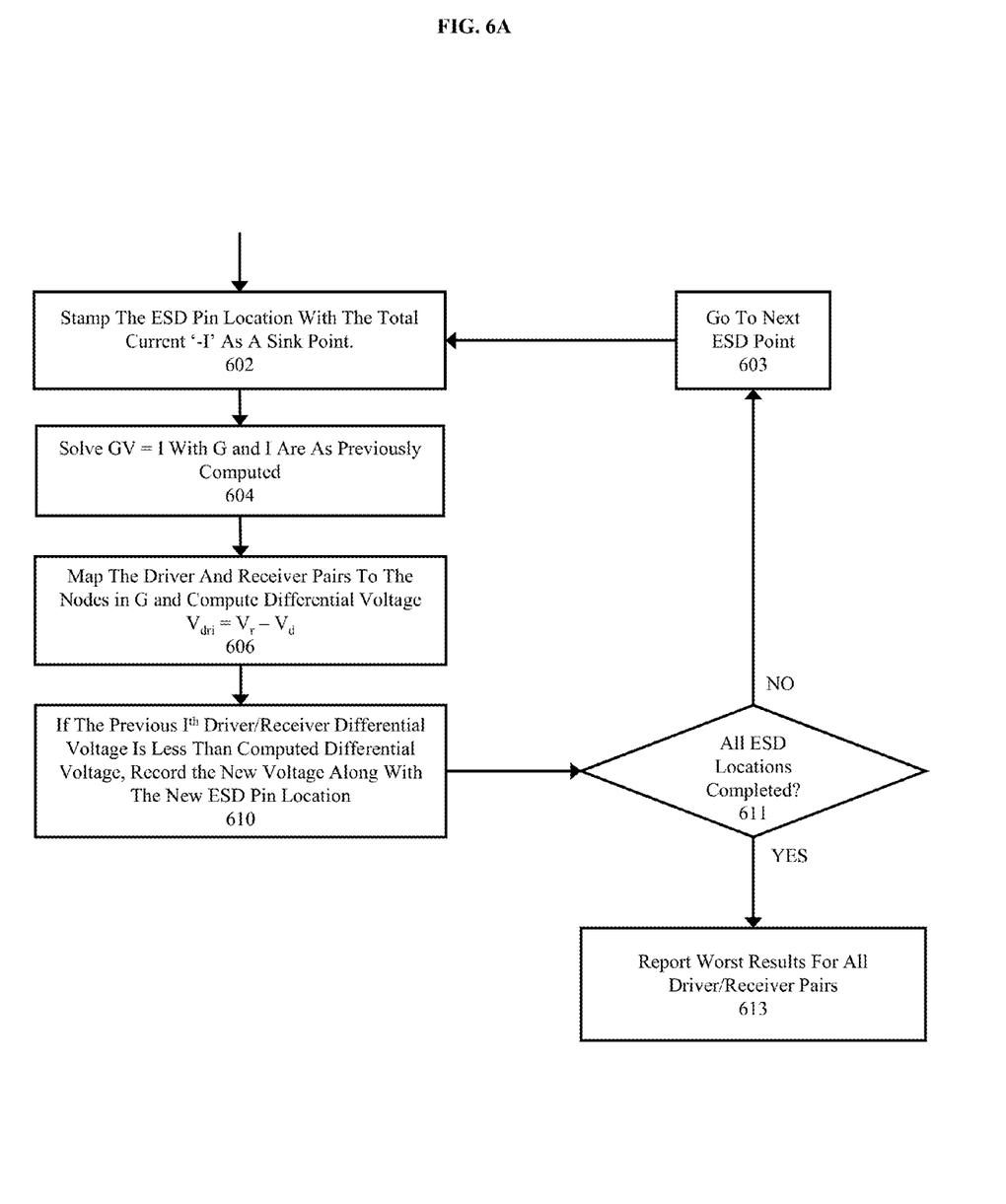
FIG. 6A shows a more detailed view of one approach to determining differential voltages for electrostatic discharge (ESD) pin location according to some embodiments of the invention.

FIG. 6A shows a more detailed view of one approach to determining differential voltages for electrostatic discharge (ESD) pin location according to some embodiments of the invention. Generally, for each ESD pin location the approach is to determine the lowest differential voltage for each driver and receiver pair.

The approach to computing the differential voltage as illustrated in FIG. 6 includes stamping an ESD pin with the total current −I as a sink point at 602, solving GV=I using G and I as previously computed at 604, mapping the driver and receiver pair instance to the nodes in G and computing a differential voltage $V_{dri}=V_r-V_d$ at 606, and if the previous $I^{th}$ driver and receiver differential voltage is less than the computed differential voltage, then the new differential voltage along with the new ESD pin location is recorded at 610. Such calculations can be performed using known techniques which will not be discussed here for the sake of brevity.

Subsequently, at 611 a determination is made as to whether all ESD locations have been completed. If all ESD locations have been completed the process is completed by reporting the worst results for all the driver and receiver pairs at 613. However, if all ESD locations have not yet been completed then at 603 the process continues by going to the next ESD point at 603.

Furthermore, as indicated above, the process is an improvement over previous methods because it does not require re-factorization. Also as indicated above, the process can be further improved by using an incremental forward solution.

Figure 6B:
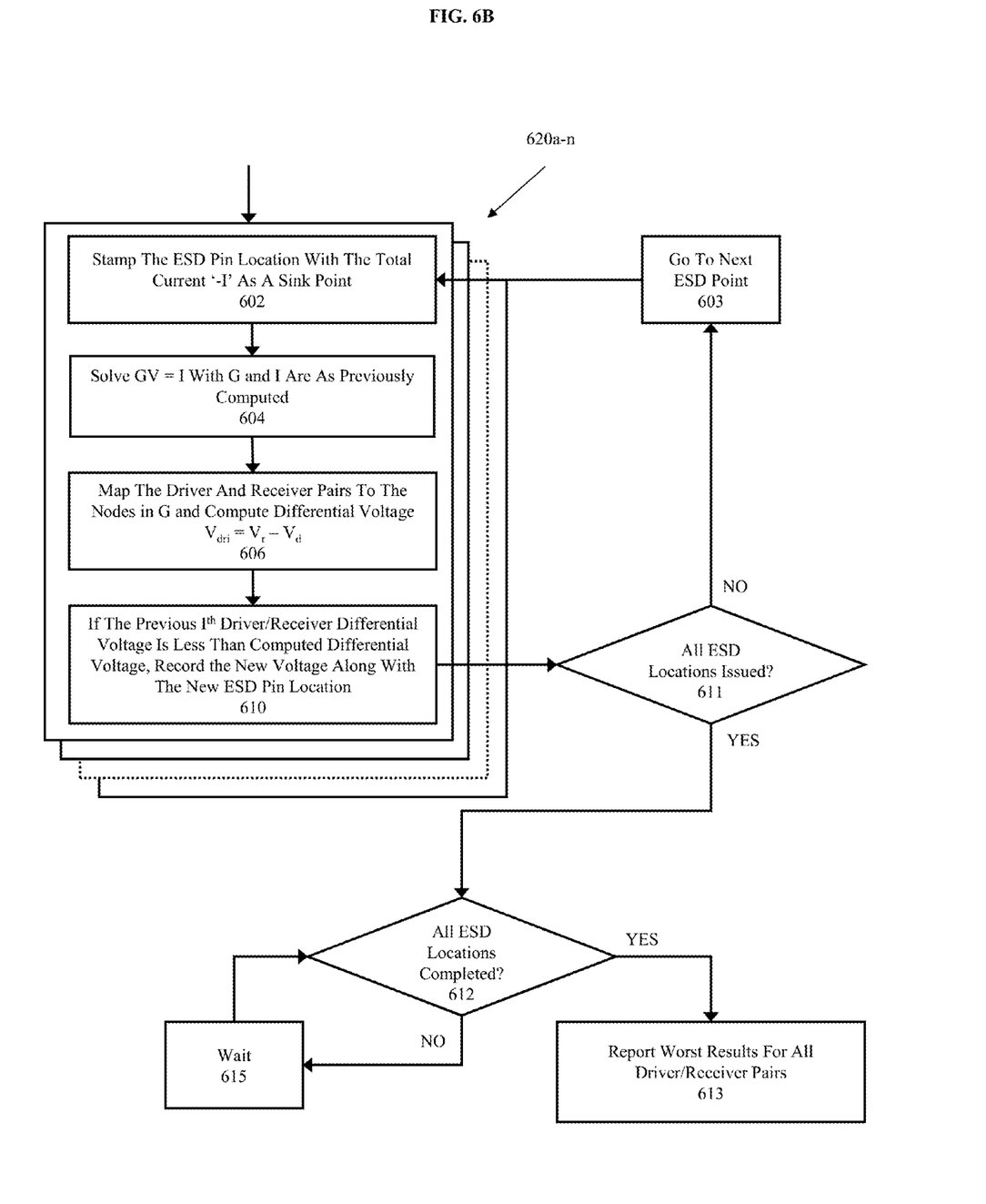
FIG. 6B shows a more detailed view of one approach to determining differential voltages for electrostatic discharge (ESD) pin location that uses parallel processing according to some embodiments of the invention

FIG. 6B shows a more detailed view of one approach to determining differential voltages for electrostatic discharge (ESD) pin locations that uses parallel processing according to some embodiments of the invention. FIG. 6B is largely similar to FIG. 6A as discussed above. However, FIG. 6B as illustrated has been modified as discussed below to enable parallelization of some aspects of the process disclosed herein.

At 620*a-n*, differential voltages of a plurality of ESD pin locations may be determined, where one or a plurality of processors may determine one or more differential voltages in parallel as discussed above in regard to 602, 604, 606, and 608. For instance, each core of a processor could be used to separately process ESD pin locations in parallel. Furthermore, multiple processors with or without multiple cores could be used to separately process ESD pin locations, or even multiple servers with multiple processors and cores could be used.

Furthermore, 611 has been modified to support parallelization of the process. Here, instead of determining whether all ESD locations have been completed, 611 determines whether all ESD locations have been issued. This avoids the possibility of the process attempting to start processing unfinished but already in progress ESD point differential voltage determinations. If it is determined at 611 that all ESD locations have been issued, then the process continues at 612, otherwise the process continues at 603 where the next ESD point is issued to an available processor.

At 612, a determination is made whether the differential voltages of all ESD points have completed. If all differential voltages for all ESD points have completed, then the process continues at 613 as discussed above. Otherwise, a period of time elapses at 615 before, at 612, the process again determines whether the differential voltages of all ESD points has been completed.

The parallel processing aspects as disclosed herein may be completed using various techniques. For instance, a single processor may be a master processor that manages the process, a single data structure may be used to store and collect interim or complete results. Furthermore, some shared data, communication and notification scheme, or some combination thereof may be used to manage the process. Furthermore, the ESD points for computation of the differential voltages may be distributed in one or more sets, such that an individual device or plurality of devices may receive multiple ESD points for computation.

Finally, not all methods of managing parallel processes are illustrated, but such techniques are generally known, such as by using a single dispatch unit, or some shared data to manage the process, or by some combination thereof, any of which could be used here.

System Architecture Overview

Figure 7:
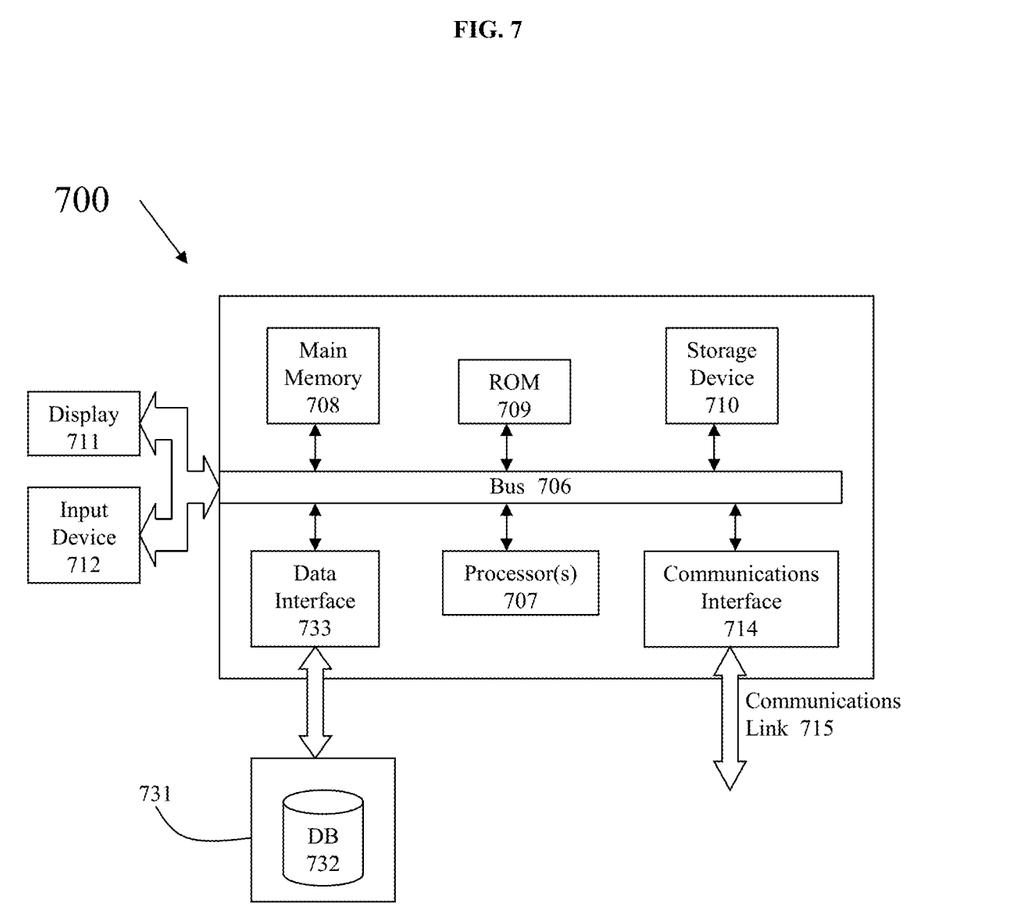
FIG. 7 is a block diagram of an illustrative computing system suitable for implementing an embodiment of the present invention.

FIG. 7 is a block diagram of an illustrative computing system suitable for implementing an embodiment of the present invention. Illustrative computing system 700 is suitable for implementing an embodiment of the present invention. Computer system 700 includes a bus 706 or other communication mechanism for communicating information, which interconnects subsystems and devices, such as processor 707, system memory 708 (e.g., RAM), static storage device 709 (e.g., ROM), disk drive 710 (e.g., magnetic or optical), communication interface 714 (e.g., modem or Ethernet card), display 711 (e.g., CRT or LCD), input device 712 (e.g., keyboard), and cursor control.

According to one embodiment of the invention, computer system 700 performs specific operations by processor 707 executing one or more sequences of one or more instructions contained in system memory 708. Such instructions may be read into system memory 708 from another computer readable/usable medium, such as static storage device 709 or disk drive 710. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 707 for execution. Such a medium may take many forms, including but not limited to, non-volatile media and volatile media. Non-volatile media includes, for example, optical or magnetic disks, such as disk drive 710. Volatile media includes dynamic memory, such as system memory 708.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 700. According to other embodiments of the invention, two or more computer systems 700 coupled by communication link 715 (e.g., LAN, PTSN, or wireless network) may perform the sequence of instructions required to practice the invention in coordination with one another.

Computer system 700 may transmit and receive messages, data, and instructions, including program, e.g., application code, through communication link 715 and communication interface 714. Received program code may be executed by processor 707 as it is received, and/or stored in disk drive 710, or other non-volatile storage for later execution. Computer system 700 may communicate through a data interface 733 to a database 732 on an external storage device 731.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method implemented with a processor, comprising:
   identifying design data for an electronic design comprising a plurality of circuits, wherein the design data is identified to perform electro static discharge (ESD) analysis upon the plurality of circuits using an electronic design automation application;
   receiving the design data into the electronic design automation application;
   identifying circuits of interest of the plurality of circuits corresponding to nets connected to ESD locations, the circuits of interest comprising circuits to be analyzed by performing ESD simulation;
   re-characterizing the circuits of interest into representations for evaluating differential voltages; and
   simulating the circuits of interest using the representations for evaluating differential voltages to determine differential voltages for electrostatic discharge pin location driver and receiver pairs, wherein only one factorization is performed to simulate the circuits of interest for driver and receiver pairs in an individual representation for evaluating differential voltages.

2. The method of claim 1, wherein identifying circuits of interest comprises identifying electrostatic discharge event pin locations and identifying a plurality of driver and receiver pairs.

3. The method of claim 1, wherein re-characterizing the identified circuits of interest comprises:
   performing a resistance only extraction of the circuit to be simulated;
   attaching a resistance to any node in the circuit and to ground;
   formulating a conductance matrix for the circuits to be simulated; and
   distributing a total current in a grid as source points.

4. The method of claim 1, wherein determining differential voltages comprises:
   stamping an electrostatic discharge location with a current sink point equal to a negative of a total current;
   determining a voltage for the driver and receiver pair using a previously determined representation and current;
   mapping the driver and receiver pair to nodes in the representation and computing the differential voltage; and
   recording the computed differential voltage for the driver and receiver pair when the differential voltage is greater then a previously determined differential voltage or no previously recorded differential voltage for the driver and receiver pair.

5. The method of claim 1, wherein determining the differential voltage is performed for each electrostatic discharge point while any electrostatic discharge points remain for simulation.

6. The method of claim 1, where determining the differential voltage is performed in parallel for a plurality of electrostatic discharge points.

7. The method of claim 1, further comprising using a forward solution to determining differential voltages for driver and receiver pairs.

8. A computer program product embodied on a non-transitory computer readable medium, the computer readable medium having stored thereon a sequence of instructions which, when executed by a processor causes the processor to execute a method comprising:
   identifying design data for an electronic design comprising a plurality of circuits, wherein the design data is identified to perform electro static discharge (ESD) analysis upon the plurality of circuits using an electronic design automation application;
   receiving the design data into the electronic design automation application;
   identifying circuits of interest of the plurality of circuits corresponding to nets connected to ESD locations, the circuits of interest comprising circuits to be analyzed by performing ESD simulation;
   re-characterizing the circuits of interest into representations for evaluating differential voltages; and
   simulating the circuits of interest using the representations for evaluating differential voltages to determine differential voltages for electrostatic discharge pin location driver and receiver pairs, wherein only one factorization is performed to simulate the circuits of interest for driver and receiver pairs in an individual representation for evaluating differential voltages.

9. The computer program product of claim 8, wherein identifying circuits of interest comprises identifying electrostatic discharge event pin locations and identifying a plurality of driver and receiver pairs.

10. The computer program product of claim 8, wherein re-characterizing the identified circuits of interest comprises:
    performing a resistance only extraction of the circuit to be simulated;
    attaching a resistance to any node in the circuit and to ground;
    formulating a conductance matrix for the circuits to be simulated; and
    distributing a total current in a grid as source points.

11. The computer program product of claim 8, wherein determining differential voltages comprises:
    stamping an electrostatic discharge location with a current sink point equal to a negative of a total current;
    determining a voltage for the driver and receiver pair using a previously determined representation and current;
    mapping the driver and receiver pair to nodes in the representation and computing the differential voltage; and
    recording the computed differential voltage when the differential voltage is less than a previously determined differential voltage.

12. The computer program product of claim 8, wherein determining the differential voltage is performed for each electrostatic discharge point while any electrostatic discharge points remain for simulation.

13. The computer program product of claim 8, where determining the differential voltage is performed in parallel for a plurality of electrostatic discharge points.

14. The computer program product of claim 8, further comprising using a forward solution to determining differential voltages for driver and receiver pairs.

15. A system for analyzing a circuit design, comprising:
    a processor;
    a memory for holding programmable code, wherein the programmable code when executed causes the processor to perform acts comprising:
      identifying design data for an electronic design comprising a plurality of circuits, wherein the design data is identified to perform electro static discharge (ESD) analysis upon the plurality of circuits using an electronic design automation application;
      receiving the design data into the electronic design automation application;

identifying circuits of interest of the plurality of circuits corresponding to nets connected to ESD locations, the circuits of interest comprising circuits to be analyzed by performing ESD simulation;

re-characterizing the circuits of interest into representations for evaluating differential voltages; and simulating the circuits of interest using the representations for evaluating differential voltages to determine differential voltages for electrostatic discharge pin location driver and receiver pairs, wherein only one factorization is performed to simulate the circuits of interest for driver and receiver pairs in an individual representation for evaluating differential voltages.

16. The system of claim 15, wherein identifying circuits of interest comprises identifying electrostatic discharge event pin locations and identifying a plurality of driver and receiver pairs.

17. The system of claim 15, wherein re-characterizing the identified circuits of interest comprises:

performing a resistance only extraction of the circuit to be simulated;

attaching a resistance to any node in the circuit and to ground;

formulating a conductance matrix for the circuits to be simulated; and distributing a total current in a grid as source points.

18. The system of claim 15, wherein determining differential voltages comprises:

stamping an electrostatic discharge location with a current sink point equal to a negative of a total current;

determining a voltage for the driver and receiver pair using a previously determined representation and current;

mapping the driver and receiver pair to nodes in the representation and computing the differential voltage; and recording the computed differential voltage when the differential voltage is less than a previously determined differential voltage.

19. The system of claim 15, wherein determining the differential voltage is performed for each electrostatic discharge point while any electrostatic discharge points remain for simulation.

20. The system of claim 15, where determining the differential voltage is performed in parallel for a plurality of electrostatic discharge points.

21. The system of claim 15, further comprising using a forward solution to determining differential voltages for driver and receiver pairs.

* * * * *